United States Patent
Lin

(10) Patent No.: US 8,462,521 B2
(45) Date of Patent: Jun. 11, 2013

(54) SHIELDING ASSEMBLY

(75) Inventor: Shih-Wei Lin, Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 163 days.

(21) Appl. No.: 13/092,150

(22) Filed: Apr. 22, 2011

(65) Prior Publication Data
US 2012/0008302 A1    Jan. 12, 2012

(30) Foreign Application Priority Data
Jul. 7, 2010   (CN) .......................... 2010 2 0250605

(51) Int. Cl.
*H05K 9/00*    (2006.01)

(52) U.S. Cl.
USPC ........... 361/818; 361/800; 361/816; 361/829; 52/846

(58) Field of Classification Search
USPC ................................................ 361/818, 679
See application file for complete search history.

(56) References Cited

U.S. PATENT DOCUMENTS

| 7,018,237 B2 * | 3/2006 | Zhan et al. ............... 439/607.55 |
| 8,039,763 B1 * | 10/2011 | Cochrane ....................... 174/377 |
| 2006/0207212 A1 * | 9/2006 | Durney ........................ 52/731.7 |

* cited by examiner

*Primary Examiner* — Tuan T Dinh
*Assistant Examiner* — Mukund G Patel
(74) *Attorney, Agent, or Firm* — Altis Law Group, Inc.

(57) ABSTRACT

A shielding assembly comprises a pair of opposite first sidewalls, a pair of opposite second sidewalls, a pair of opposite first covers, a pair of latching portion and a pair of opposite second covers. The first sidewalls and the second sidewalls are connected with each other to collectively form a hollow frame. The first covers are resiliently connected to the first sidewalls, respectively, and suitable to be bent to collectively cover the hollow frame. The pair of latching portions extend the first covers and are bent perpendicular to the first covers, respectively. A pair of gaps are defined respectively on two tail ends of each of the latching portions. The second covers are resiliently connected to the second sidewalls, respectively, and are bent to cover on the first covers and latched in corresponding gaps.

3 Claims, 4 Drawing Sheets

SHIELDING ASSEMBLY

BACKGROUND

1. Technical Field

The disclosure generally relates to shielding assemblies.

2. Description of Related Art

In order to protect electronic components on a circuit board of an electronic device from electromagnetic interference (EMI), shielding assemblies are generally employed to cover the electronic components. A commonly used shielding assembly is made by punching a metal piece and soldering the punched metal piece to the circuit board. With this structure, to repair the electronic components, the shield must be disassembled from the circuit board with special tools, which is inconvenient and may become damaged and deformed and becomes unusable in the disassembly process the shield.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
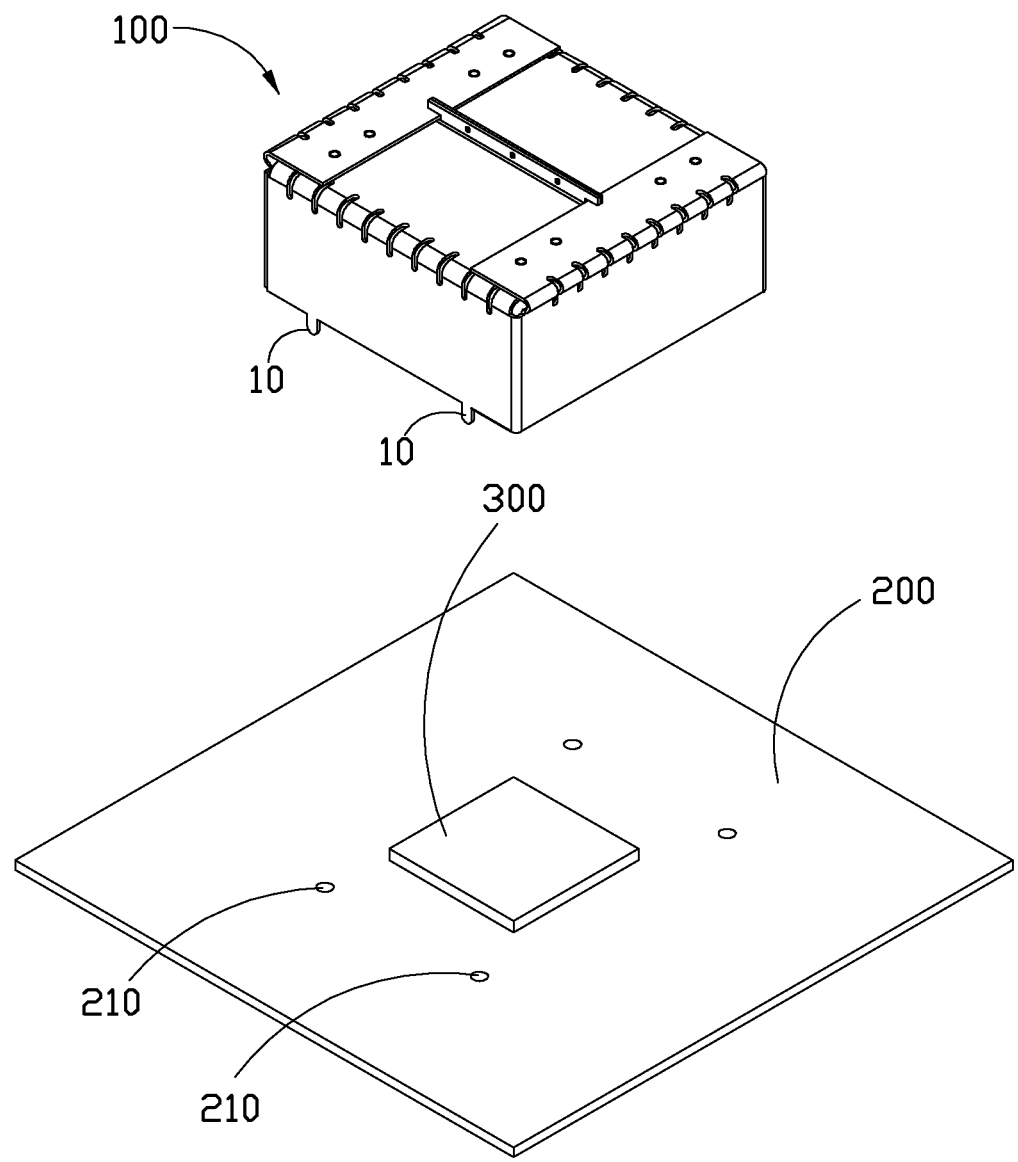
FIG. 1 is a perspective, isometric view of a shielding assembly in accordance with a first embodiment of the disclosure, in which the shielding assembly is mounted to a circuit board to protect an electronic component from electromagnetic interference.

FIG. 1 is a perspective, isometric view of a shielding assembly 100 in accordance with an exemplary embodiment of the disclosure. The shielding assembly 100 is mounted to a circuit board 200 to protect an electronic component 300 positioned on the circuit board 200 from electromagnetic interference (EMI). The circuit board 200 defines a plurality of fixing holes 210, and the shielding assembly 100 comprises a plurality of pins 10 capable of being received in the plurality of fixing holes 210, respectively. The shielding assembly 100 is fixed on the circuit board 200 via soldering.

Figure 2:
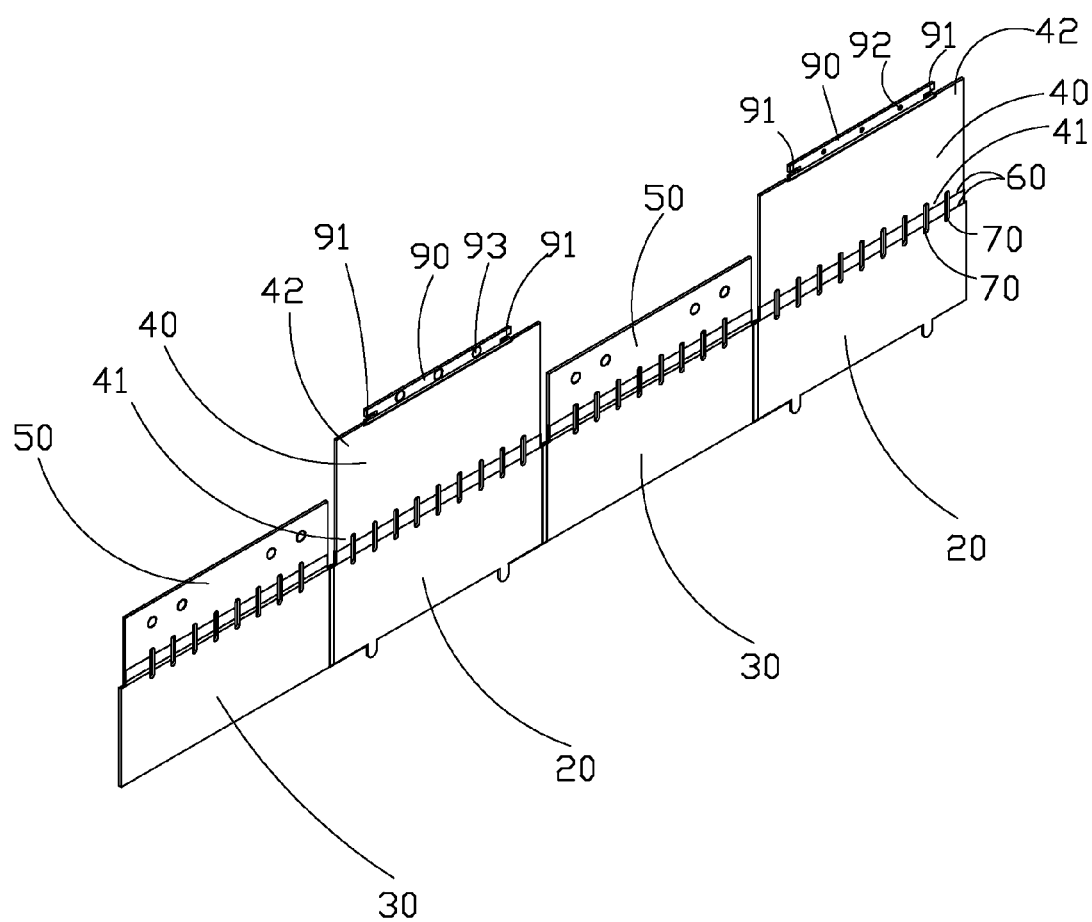
FIG. 2 is a disassembled perspective view of the shielding assembly of FIG. 1.
Figure 3:
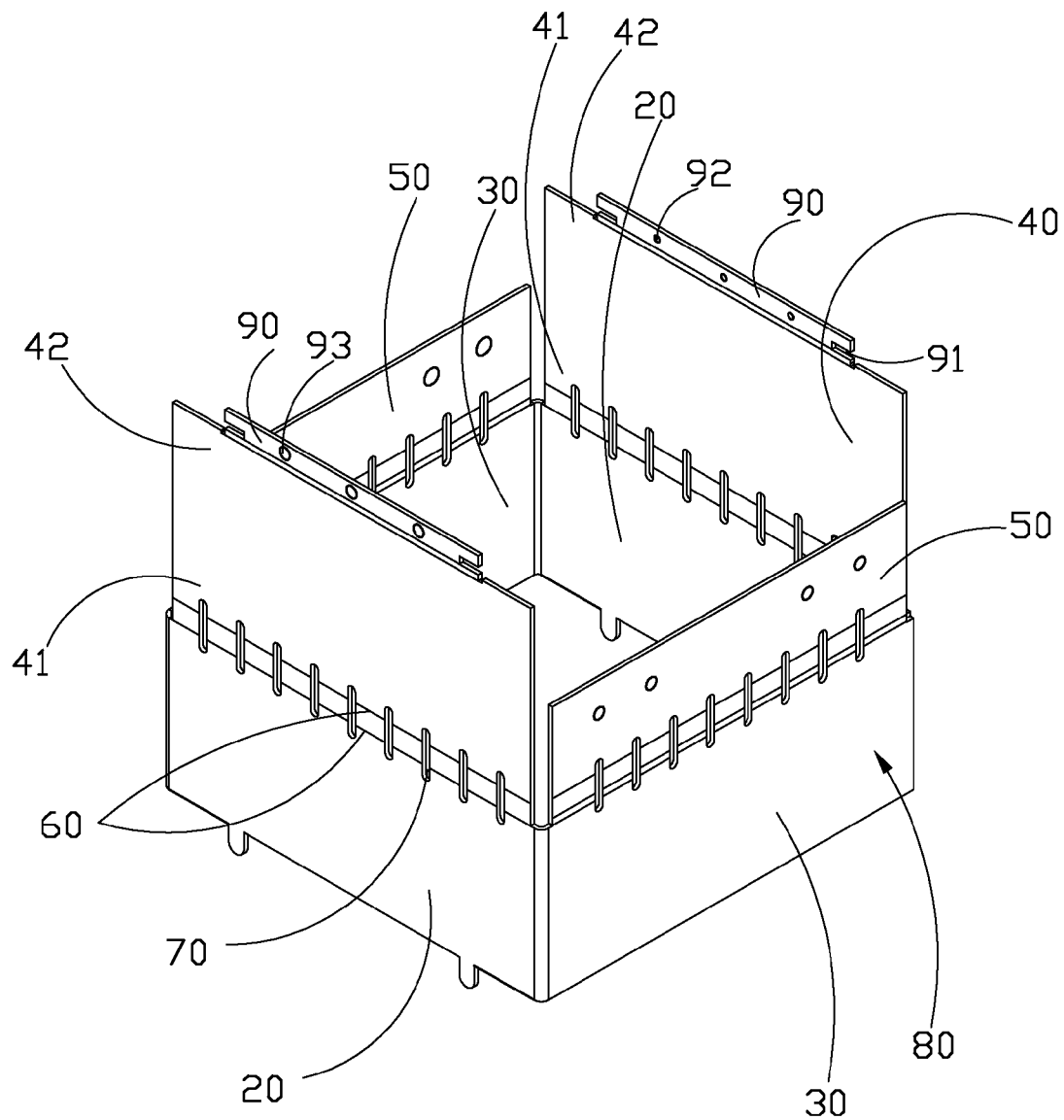
FIG. 3 is a perspective view of the shielding assembly of FIG. 1, showing a pair of opposite first sidewalls and a pair of opposite second sidewalls collectively forming a hollow frame.
Figure 4:
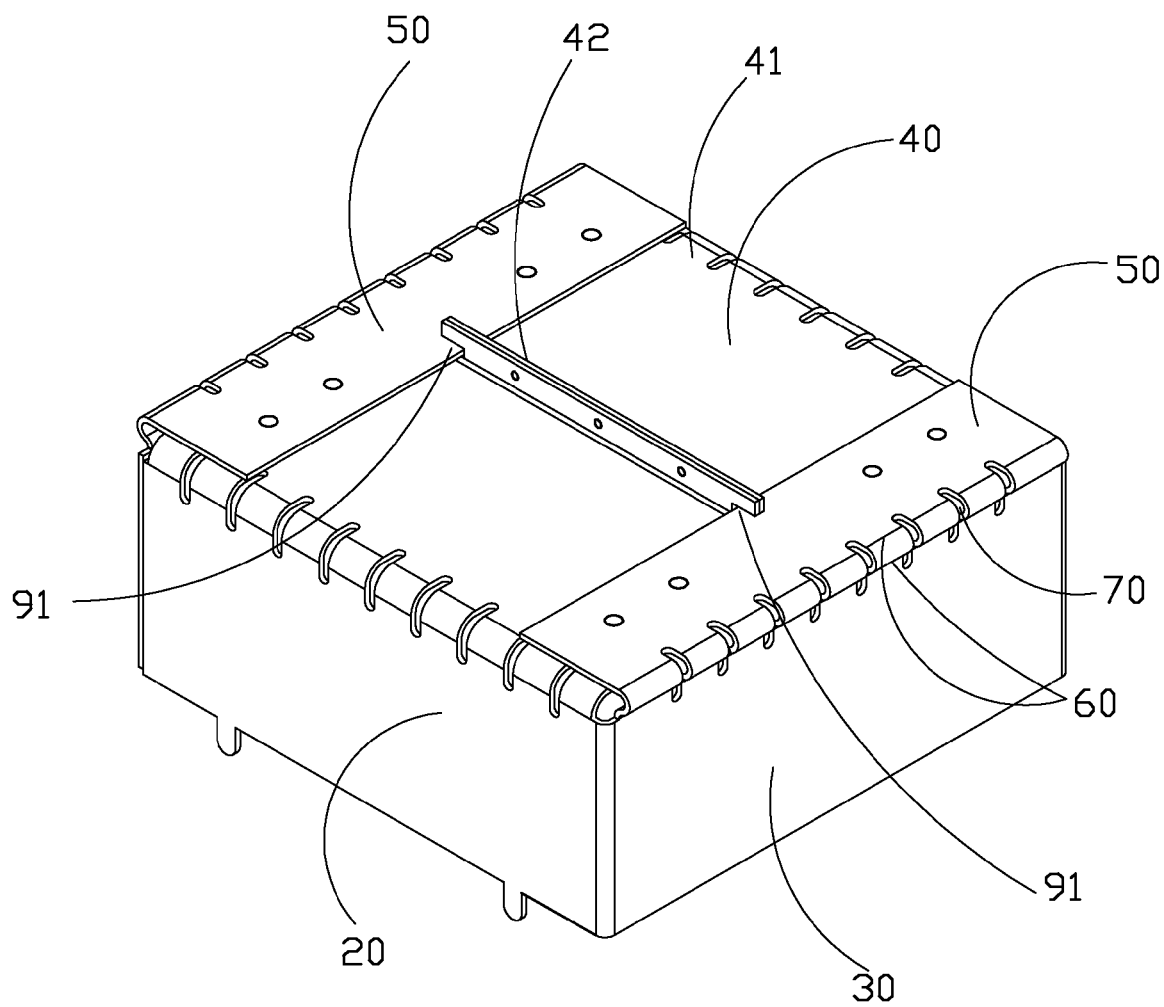
FIG. 4 is an enlarged view of the shielding assembly of FIG. 1.

FIG. 2 is a disassembled perspective view of the shielding assembly 100 of FIG. 1. With reference to FIG. 2, FIG. 3 and FIG. 4, the shielding assembly 100 comprises a pair of opposite first sidewalls 20, a pair of opposite second sidewalls 30, a pair of opposite first covers 40, a pair of opposite second covers 50 and a pair of latching portions 90, which are made from one part, such as one metal sheet by punching. The first sidewalls 20 and the second sidewalls 30 are connected with each other to collectively form a hollow frame 80, as shown in FIG. 3. The first covers 40 are resiliently connected to the first sidewalls 20, suitable to be bent to cooperatively cover the hollow frame 80. In details, each of the first covers 40 comprises a first side 41 and a second side 42, and the first side 41 of each of the first cover 40 is resiliently connected to corresponding one of the first sidewalls 20, and the second side 42 of one of the first covers 40 joints with that of another one of the first covers 40, as shown in FIG. 4. In this way, the first covers 40 joints together to cover the hollow frame 80.

The latching portions 90 extend from the second sides 42 of the first covers 40, respectively, as shown in FIG. 3. In the embodiment, each latching portion 90 could be bent relatively to corresponding first cover 40. For example, as shown in FIG. 4, the latching portions 90 are bent perpendicular to the first covers 40, respectively. A pair of gaps 91 are defined respectively on two tail ends of each of the latching portions 90 and opposite to the pair of second covers 50. The second covers 50 are resiliently connected to the second sidewalls 30 respectively, and could be bent to cover on the first covers 40 and latched in corresponding gaps 91. That is, the second covers 50 are located on the first covers 40 and engage with the gaps 91 to limit the first covers 40 from stretching under the resilience between the first covers 40 and the first sidewalls 20.

In the embodiment, one of the latching portions 90 defines a plurality of recesses 92, and another one of the latching portions 90 comprises a plurality of projections 93 corresponding to the recesses 92. In assembly, the projections 93 are respectively received in the plurality of recesses 92 to join the latching portions 90 firmly.

In the embodiment, each of junction portions between the first sidewalls 20 and the first covers 40 comprises a pair of parallel creases 60, as well as that between the second sidewalls 30 and the second covers 50. The parallel creases 60 are structured to bend the first and second covers 40, 50 with respective to the first and second sidewalls 20, 30 easily.

In the embodiment, the junction portions define a plurality of strip shaped holes 70 extending between the parallel creases 60. The strip shaped holes 70 are defined to reduce bending intensity of the junction portions during bending the first and second covers 40, 50 relatively to the first and second sidewalls 20, 30.

In the embodiment, the shielding assembly 100 is made from one metal sheet punched by a single module, and the shielding assembly 100 is shaped by bending the punched metal sheet.

During assembly of the shielding assembly 100, the first sidewalls 20 and the second sidewalls 30 are bent toward each other to form the hollow frame 80. The first covers 40 are bent along the creases 60 and toward each other to cover the hollow frame 80, the latching portions 90 are bent to be perpendicular to the first covers 40 and joint with each other. The second covers 50 are bent along the creases 60 and toward each other to be latched to the gaps 92. In this way, the shielding assembly 100 is shaped to be a sealed cover.

To repair the electronic component 300, the second covers 50 are released from the gaps 92 under an external force, and as a result, the first covers 40 stretch relative to the first sidewalls 20 under the resilience between the first covers 40 and the first sidewalls 20. As a result, the shielding assembly 100 is opened.

The shielding assembly 100 can be opened and closed by opening or closing the first covers 40 and the second covers 50, and can be used many times, which leads to convenience and low cost repairs to the electronic component 300.

While the exemplary embodiments have been described, it should be understood that it has been presented by way of example only and not by way of limitation. The breadth and scope of the disclosure should not be limited by the described exemplary embodiments, but only in accordance with the following claims and their equivalents.

What is claimed is:

1. A shielding assembly, comprising:
    a pair of opposite first sidewalls;
    a pair of opposite second sidewalls, the first sidewalls and the second sidewalls connected with each other to collectively form a hollow frame;
    a pair of opposite first covers resiliently connected to the first sidewalls respectively, and suitable to be bent to cooperatively cover the hollow frame;
    a pair of latching portions respectively extending from the first covers, each of the latching portions being bent relatively to a corresponding first cover, and a pair of gaps defined respectively on two tail ends of each of the latching portions;
    wherein one of the latching portions defines a plurality of recesses, and another one of the latching portions comprises a plurality of projections received in the plurality of recesses, respectively.
    and a pair of opposite second covers resiliently connected to the second sidewalls, respectively, and being bent to cover the first covers and latched in corresponding gaps.

2. The shielding assembly as claimed in claim 1, wherein each of junction portions between the first covers and the first sidewalls comprises a pair of parallel creases, as well as that between the second covers and the second sidewalls.

3. The shielding assembly as claimed in claim 2, wherein the junction portions define a plurality of strip shaped holes extending between the parallel creases.

* * * * *